United States Patent [19]

Melocik et al.

[11] 4,445,090

[45] Apr. 24, 1984

[54] VOLTAGE LEVEL MONITORING AND INDICATING APPARATUS

[75] Inventors: Grant C. Melocik, Chardon, Ohio; Steven E. Blight, Peoria, Ill.

[73] Assignee: Towmotor Corporation, Mentor, Ohio

[21] Appl. No.: 303,254

[22] PCT Filed: Aug. 26, 1981

[86] PCT No.: PCT/US81/01152

§ 371 Date: Aug. 26, 1981

§ 102(e) Date: Aug. 26, 1981

[87] PCT Pub. No.: WO83/00740

PCT Pub. Date: Mar. 3, 1983

[51] Int. Cl.$^3$ .............................................. G01N 27/46
[52] U.S. Cl. ................................... 324/433; 324/426; 324/427; 320/48; 364/481; 364/483
[58] Field of Search ................................. 324/426–429, 324/433–436, 63, 64, 73 AT; 320/48; 307/60, 75; 323/297–299, 354; 364/481, 483, 571; 363/50–52

[56] References Cited

U.S. PATENT DOCUMENTS 2,958,823 11/1960 Rabier .................................. 364/481
4,322,685 3/1982 Frailing et al. ...................... 324/427

OTHER PUBLICATIONS

*Principles of Electronic Instrumentation*, A. James Diefenderfer, W. B. Saunders Co., Philadelphia, 1979, pp. 326, 327.
Curtis 933 Service Manual (Preliminary).

Primary Examiner—Michael J. Tokar
Assistant Examiner—Kevin D. O'Shea
Attorney, Agent, or Firm—Stephen L. Noe

[57] ABSTRACT

A voltage level monitoring and indicating apparatus (10) including a voltage-to-frequency converter (12), an input conditioning circuit (16) that shifts voltage signals received from different voltage sources to the same input level for the converter (12) which then produces a proportional output frequency signal, a microprocessor (40) which is software programmed to produce voltage level data in response to the output frequency signal from converter (12), and a display (42) which displays a range of numbers in response to the voltage level data. Prior apparatus are not state-of-the-art microprocessor based and require different designs when coupled to different voltage sources. The present invention is microprocessor based and has the same input conditioning circuit that can be coupled to different voltage sources for use principally to indicate voltage levels of batteries on electric fork lift trucks.

14 Claims, 5 Drawing Figures

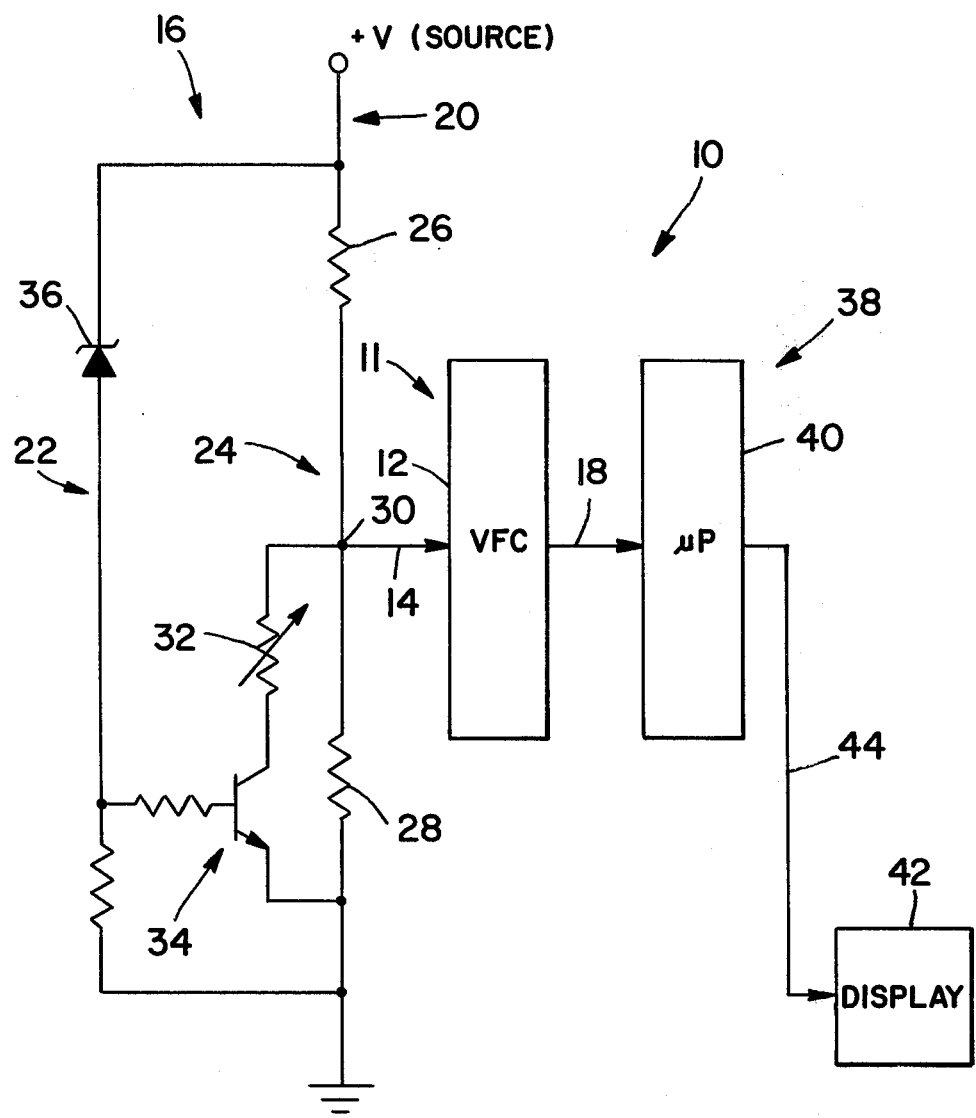
FIG_1

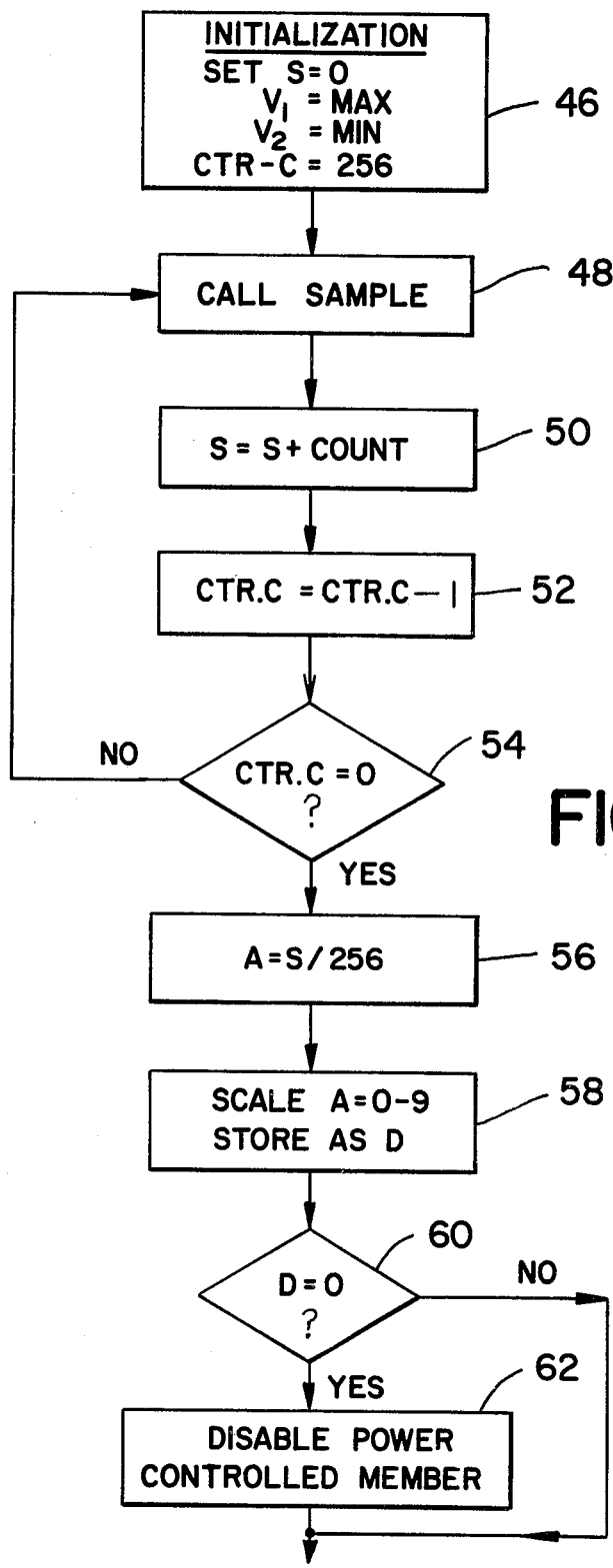
FIG_2A

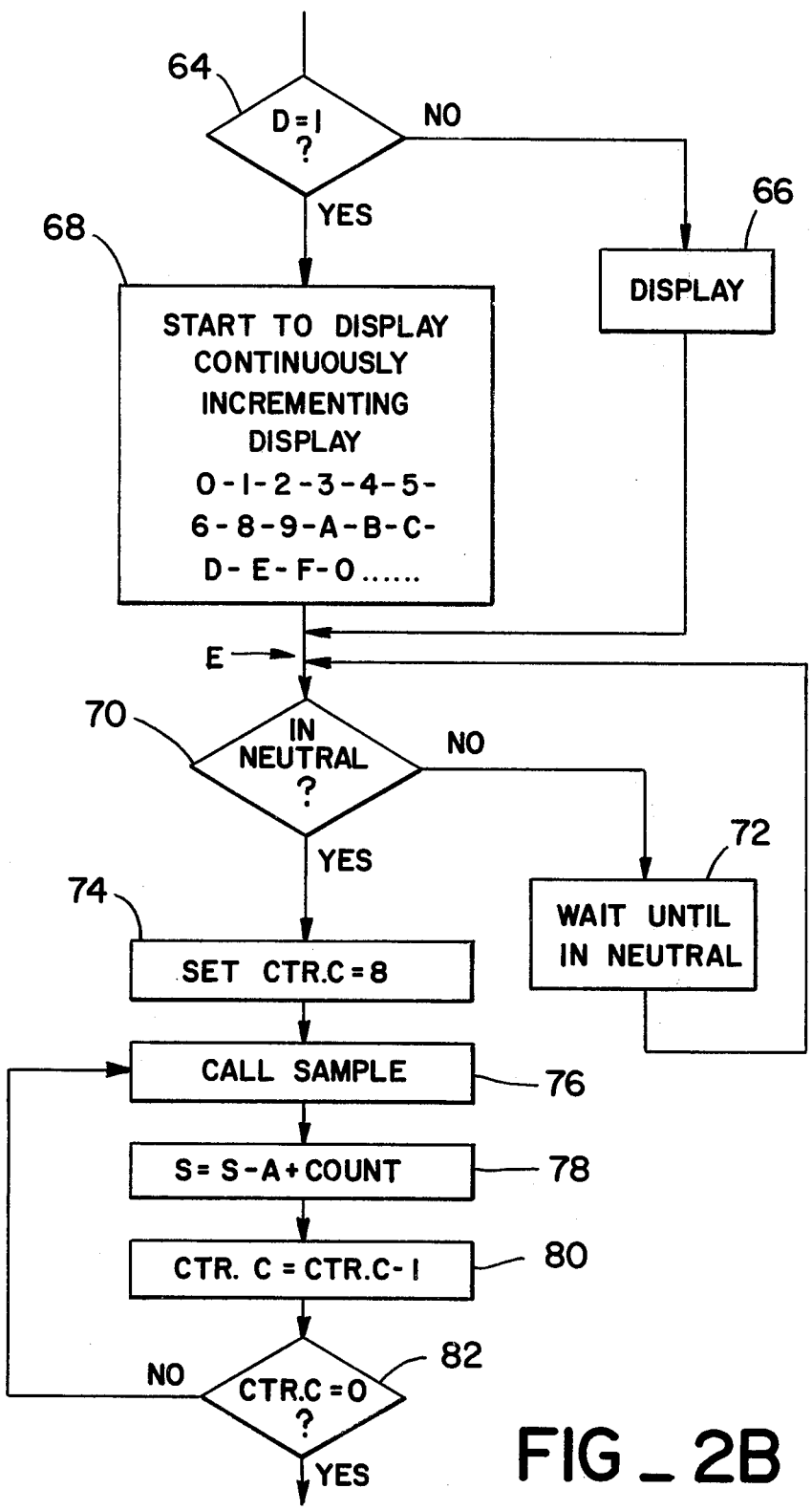
FIG_2B

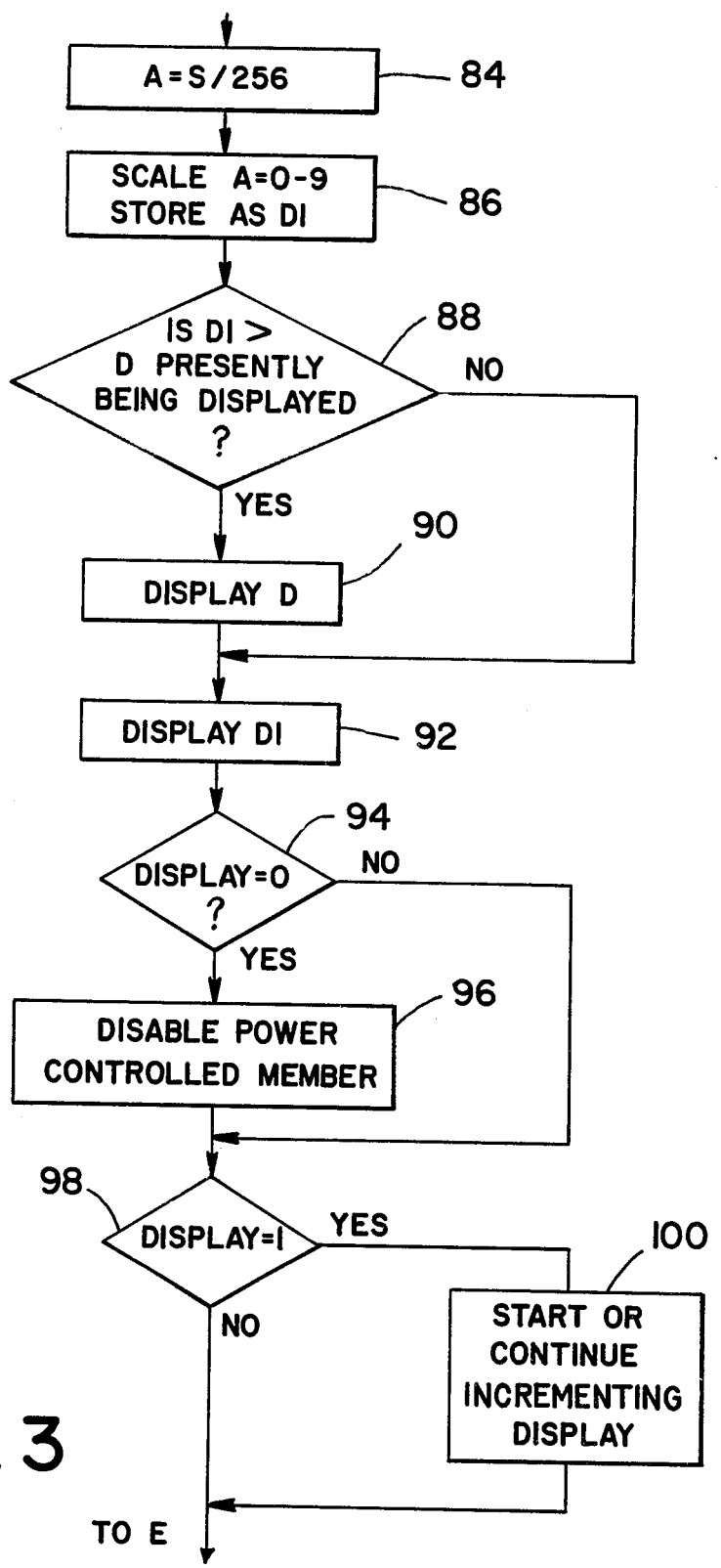
FIG_3

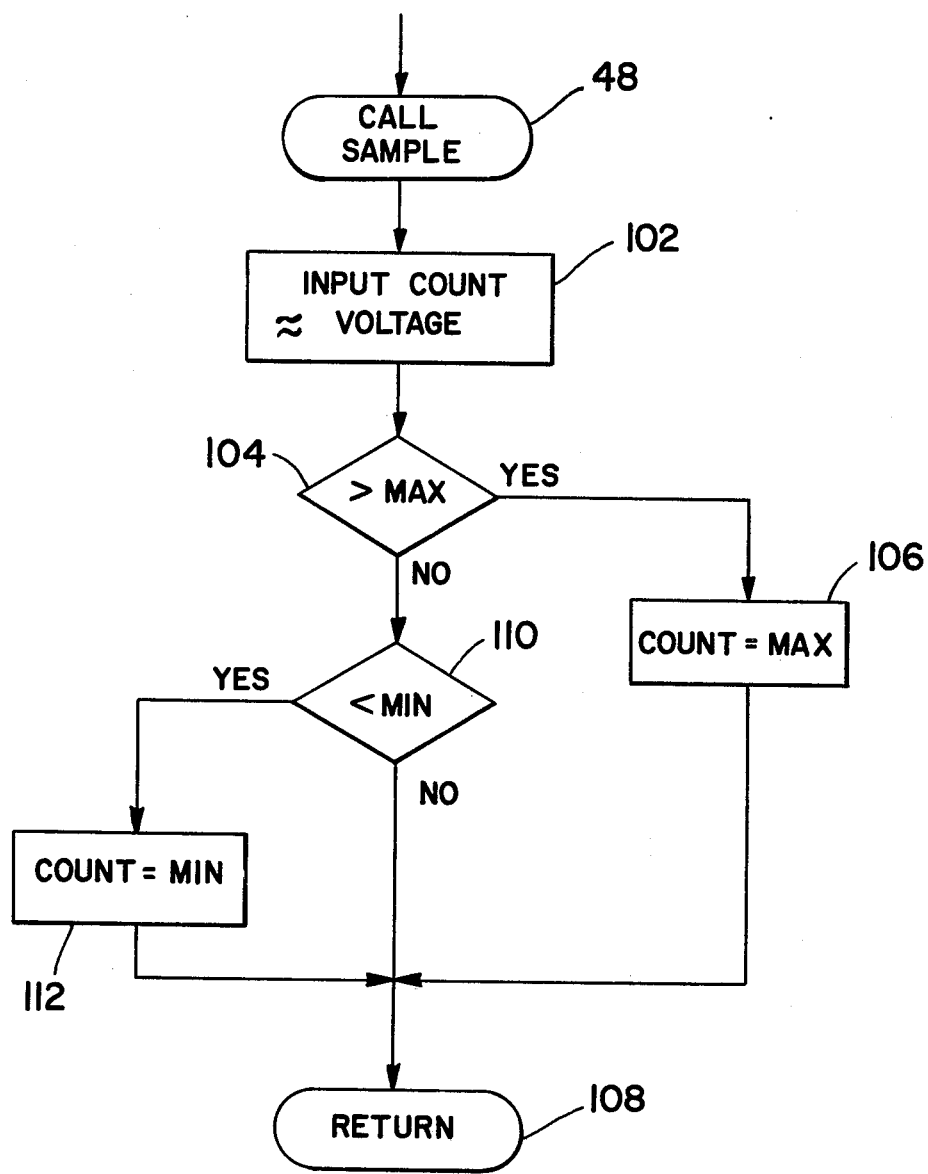
FIG_4

VOLTAGE LEVEL MONITORING AND INDICATING APPARATUS

DESCRIPTION

1. Technical Field

This invention relates generally to voltage level monitoring and indicating apparatus and, more particularly, to apparatus for monitoring and indicating the discharge level of a battery.

2. Background Art

In a variety of systems, and for many reasons, it is important to have information or data concerning the voltage level or charge remaining in an energy storage device. For example, in a vehicle such as an electric lift truck, the voltage level or amount of charge remaining in the battery should be monitored and displayed to avoid potential problems. If the battery is used when it has been overly discharged, damage can occur to the battery as well as to electrical components such as motors and controllers that are supplied with power from the battery.

Electronic monitoring and display systems or apparatus have been developed to produce such information to avoid the problems resulting from an overly discharged battery. In one system, the instantaneous battery voltage is compared to a reference voltage. Whenever the instantaneous battery voltage is less than the reference voltage, an oscillator is turned on, whose pulses are counted by a counter. The counter outputs are fed to a digital-to-analog converter which drives the pointer of a gauge indicating the level of charge remaining in the battery. The output of the converter is also fed back to change the reference voltage. Thus, as the battery discharges, the counter is advanced, causing the converter to move the pointer on the gauge from a fully charged towards a fully discharged position and also to reduce the reference voltage.

One problem with the above monitoring and display systems relates to its application for use in state of the art vehicles. As the state of the art advances, these vehicles will have minicomputers including microprocessors to perform a number of functions. However, the prior monitoring and display system is not designed to be used with minicomputers and is expensive.

Furthermore, the prior monitoring and display system is a dedicated system in that it is designed or calibrated for use with a battery of one rated voltage, e.g., a 24 volt battery. A different design or calibration of the prior monitoring and display system would have to be implemented should it be used with, for example, a 36 volt battery. The requirement for two implementations enhances substantially the cost for producing a monitoring and display system for use with different batteries supplying different voltages.

The present invention is directed to overcoming one or more of the problems as set forth above.

DISCLOSURE OF THE INVENTION

In one aspect of the present invention, a voltage level monitoring and indicating apparatus includes means for displaying data representing a voltage level. The improvement comprises a voltage-to-frequency converter having an input and an output and being constructed to produce a pulse frequency signal at the output proportional to a voltage signal at the input, and means for controlling the displaying means in response to the pulse frequency signal.

Means is included to receive a first voltage signal from a first voltage source or a second different voltage signal from a second different voltage source and to shift the first voltage signal and the second voltage signal to the same level and to supply the level shifted first voltage signal or the level shifted second different voltage signal to said input.

Prior voltage level monitoring and display systems are not minicomputer or microprocessor based systems and each design is dedicated to only one energy storage device. The present invention includes a microprocessor based voltage level monitoring and indicating apparatus and has a single design of a converter that can be used in connection with different energy storage devices.

BRIEF DESCRIPTION OF THE DRAWINGS

FIG. 1 is a block diagram of an embodiment of the present invention.

FIG. 2A, FIG. 2B, FIG. 3 and FIG. 4. show flow charts of software used in the present invention.

BEST MODE FOR CARRYING OUT THE INVENTION

FIG. 1 shows a voltage level monitoring and indicating apparatus 10 that is used to monitor and display data of the voltage level or amount of charge remaining in an energy storage device or source +V. As one example, the source +V being monitored can be a battery (not shown).

A means 11 converts its input signal to an output signal proportional to the input signal. Means 11 is a voltage-to-frequency converter 12 having an input 14 receiving a variable voltage signal as the input signal from an input conditioning circuit 16 whose input itself is a voltage signal from the source +V. Converter 12 produces a pulse train at an output 18 as the output signal having a frequency proportional to the variable voltage signal at input 14. As one example, voltage-to-frequency converter 12 can be model RC4151, manufactured by the Raytheon Corporation of Mountain View, Calif.

Input conditioning circuit 16 has means 20 for receiving the source voltage signal from the source +V. Circuit 16 also has means 22 for automatically shifting or modifying this voltage signal to the same voltage signal level at input 14 whether the source +V is any one of a plurality of different predetermined sources such as a 24 volt supply or a 36 volt supply. In other words, in response to the source voltage signal being either of a first and second predetermined magnitude, for example 24 volts and 36 volts, the means 22 automatically modifies the source voltage signal and forms a predetermined output voltage signal that is delivered to the input 14. Means 22 has a voltage divider 24 which serves to modify the source voltage signal. This voltage divider 24 includes a resistor 26 and a resistor 28, in which the output of voltage divider 24 is taken at a junction 30 coupled to the input 14. A series-connected resistor 32 and transistor 34 are connected in parallel across the resistor 28. A zener diode 36 is connected in parallel across resistor 26 and resistor 28 and to the base of transistor 34. Zener diode 36 is constructed to be nonconductive when means 20 is coupled to one of the plurality of voltage sources, for example, source +V of 24 volts, and is conductive when means 20 is coupled to another of the plurality of voltage sources, for example, source +V of 36 volts. Resistor 32 can be variable for reasons to be described below.

If means 20 is connected to the 24 volt source +V so that zener diode 36 does not conduct, the received voltage signal from this source is shifted or divided by resistor 26 and resistor 28 of the voltage divider 24 and supplied to input 14 as the predetermined output voltage signal. If means 20 is connected to the 36 volt source +V so that zener diode 36 is conductive, transistor 34 is turned on to operatively couple resistor 32 in parallel with resistor 28. This shifts the received voltage signal from 36 volt source to the same voltage level at input 14 that the output voltage signal would be if the source +V were the 24 volt source where both the 24 and 36 volt sources are fully charged storage batteries having these respective nominal voltages. Thus, converter 12 will produce a pulse train of the same frequency at output 18 whether the input conditioning circuit 16 is connected to one source +V, for example 24 v., or a different source +V, for example 36 v. Variable resistor 32 is an alignment resistor that is preset to produce the same level of voltage signal at input 14 as is produced by the one source +V such as the 24 volt supply should the source +V be the different source such as the 36 volt supply. Additional zener-transistor-variable resistor circuits could be incorporated to accommodate sources +V of other predetermined magnitudes.

A data processor means 38 such as a microprocessor 40 is software programmed to control a display means 42 with voltage level data over a line 44 in response to the frequency of the pulse train being received on output 18. Microprocessor 40 controls display means 42 to display voltage level data indicating the voltage level or remaining charge of source +V. Microprocessor 40 can be, for example, model MK3870 manufactured by the MOSTEK Corporation of Carrollton, Tex. and display means 42 can be a conventional LED display.

Microprocessor 40 is software programmed in accordance with the flow chart of FIG. 2A, FIG. 2B, FIG. 3 and FIG. 4. At start-up, as part of an initialization procedure (block 46), a storage register S is set equal digitally to 0, a storage register $V_1$ is set equal digitally to a predetermined maximum number, and a storage register $V_2$ is set equal digitally to a predetermined minimum number. As will be discussed, display means 42 will display numbers in the range 0-9 in which 9 represents a fully charged source +V and 0 represents a fully discharged source +V. The initialization procedure also includes setting a counter C equal digitally to 256.

Then, a sample of source voltage data in the form of the pulse frequency signal on line 18 is called by microprocessor 40 (block 48). Microprocessor 40 counts the number of pulses received on line 18 over a period of time. In response to this count, a digital number representing the level of source voltage is produced and added to the digital number stored in register S (block 50). Next, counter C is decremented by 1 (block 52) and, if counter C does not equal 0 (block 54), a loop is executed in which the program again proceeds through blocks 48, 50, 52, 54.

The loop is executed for 256 counts of counter C which correspond to 256 samples of source voltage data. At the completion of this sampling, register S stores a digital number representing the sum of 256 samples of the source voltage data (block 50) and counter C is equal to 0 (block 54). Then, microprocessor 40 calculates the average source voltage by dividing the number stored in register S by 256 to produce an average digital number which is stored in a register A (block 56) for this initial start-up period. One purpose for calculating an average over a large number of samplings is to reduce the effect of spurious voltage data or glitches that might occur for any number of reasons.

Next, the digital number in register A (block 56) is scaled to a digital number in the range 0-9 and stored in a register D (block 58). If register D equals 0 (block 60), indicating a fully discharged source +V, a power controlled member, such as a fork lift carriage of a lift truck, is disabled (block 62). This can occur, for example, by opening an electrical contactor (not shown) that couples power from source +V to the controlled member so as possibly not to damage source +V or the controlled member. If register D does not equal 0 (block 60) and does not equal 1 (block 64) (see FIG. 2B), or after disabling the power controlled member (block 62), if register D does not equal 1 (block 64), then the scaled number is displayed (block 66) on display means 42.

If register D is equal to 1 (block 64), indicating a low level of source voltage, then numbers 0-9 and letters A-F are displayed continuously in sequence (block 68). By incrementing continuously the display means 42, a warning will be produced that the source +V is in a low voltage condition and that the controlled member may be disabled shortly.

After this initial start-up in which the average of 256 samples is displayed (block 66) or the sequence is displayed (block 68), a reading of the voltage level of source +V is taken only when the vehicle is in neutral. This is the time when there is constant current draw, and the source +V hasn't dropped due to high current draws. Therefore, if the lift truck is not in neutral (block 70), the program waits until it is in neutral (block 72).

If the lift truck is in neutral (block 70), counter C is set equal to 8 (block 74). Then, a sample of source voltage data is called (block 76), as in block 48, to produce a count or digital number representing the level of source voltage. This count is then added to the summation of the previous 256 samples stored in register S (see block 50), and the previous average stored in register A (see block 56) is subtracted (block 78). Then, counter C is decremented by 1 (block 80) and, if counter C does not equal 0 (block 82), a loop is executed in which the program proceeds through blocks 76, 78, 80, 82.

The loop is executed for 8 counts of counter C which correspond to 8 additional samples of source voltage data. The subtractions of the average in register A (block 78) makes room for these 8 samples. At the completion of this sampling, when counter C is equal to 0 (block 82), a new average is calculated and stored in register A (block 84) (FIG. 3). This allows a slow change in the average so that a bad reading will not be displayed on display means 42. Also, this allows time for source +V to recover if it has just been used extensively.

Next, the new average stored in register A is scaled to a digital number in the range 0-9 and stored in a register D1 (block 86). If the number in register D1 is greater than the number in register D presently being displayed (block 88), then the number in register D continues to be displayed (block 90). If not, then the number in register D1 is displayed (block 92). Thus, display means 42 is monotonic i.e., always decrementing so that it will not display a higher number once a lower number has been displayed, except when sequencing (block 68).

Next, if the display is equal to 0 (block 94), the power controlled member is disabled (block 96). If not, and the display is equal to 1 (block 98), or after disabling the power controlled member (block 96) if the display is equal to 1 (block 98), then the display starts or continues to be incremented continuously to show the sequence 0-9, A-F (block 100). If the display does not equal 1 (block 98), then the program enters at entry point E (block 70) (FIG. 2B) when the lift truck is next in neutral.

FIG. 4 shows a subroutine when calling a sample (e.g., block 48). A count is obtained in response to the frequency signal on line 18 that is proportional to the voltage level of source +V (block 102). If this count is greater than a maximum initially set in register $V_1$ (block 104), the count is set equal to this maximum (block 106) and a return is made (block 108). If not, and if the count is less than the minimum initially set in register $V_2$ (block 110), the count is set to this minimum (block 112) and the return is made (block 108). If the count is not greater than the maximum (block 104) nor less than the minimum (block 110), the return is made (block 108). These maximum and minimum values represent the maximum and minimum voltages that are expected to be seen in the system at start-up. If the voltages are greater than the maximum or less than the minimum it is assumed that this is a temporary mistake or a fluke. Thus, the count is set either to max (block 106) or min (block 112).

INDUSTRIAL APPLICABILITY

The system 10 can be installed on, for example, an electric fork lift truck to monitor and display data representing the voltage level of a source +V such as a battery. As the lift truck is used and the battery is discharged, the voltage-to-frequency converter 12 will produce at output 18 a pulse frequency signal proportional to the voltage signal at input 14. Microprocess 40, under software control, periodically will convert the frequency signal to voltage level data on line 44 which represents a range of numbers 0-9 that will be displayed on display means 42.

Should the battery voltage drop to a low level, e.g., register D=1, then the microprocessor 40 will inform the vehicle operator of this condition by controlling display means 42 to display the sequence of numbers 0-9 and letters A-F. In the event the battery is fully discharged, i.e., register D=0, microprocessor 40 will disable power controlled members such as motors driving a fork lift mast by opening contactors through which battery power is supplied to the motors.

In summary, the present invention is a state-of-the art microprocessor based system 10 which monitors and indicates changing voltage levels of any source +V, and is inexpensive relative to prior systems. Also, the input conditioning circuit 16 adds flexibility in that the same converter 12 can be coupled to different sources such as a 24 volt battery or a 36 volt battery.

Other aspects, objects and advantages of this invention can be obtained from a study of the drawings, the disclosure and the appended claims.

We claim:

1. In a voltage level monitoring and indicating apparatus (10) including means (42) for displaying data representing a voltage magnitude of a voltage source, the improvement comprising:

means (20) for receiving a voltage level signal from said voltage source;

a voltage to frequency converter (12) having an input (14) and an output (18), said input (14) being connected to said means (20), said converter (12) being constructed to produce a pulse frequency signal at said output (18) proportional to the magnitude of a first voltage level signal at said input (14);

means (38) for receiving said pulse frequency signal and controlling said displaying means (42) in response to said received pulse frequency signal; and means (22) for automatically shifting the magnitude of a predetermined voltage level signal received from said voltage source to a signal having a magnitude equal to the magnitude of said first voltage level signal at said input (14).

2. A voltage level monitoring and indicating apparatus (10), as set forth in claim 1, wherein said shifting means (22) includes:

a voltage divider (24) having first and second resistors (26, 28), said input (14) being connected between said first and second resistors (26, 28); and a third resistor (32) connected in series with a transistor (34), said series connected resistor (32) and transistor (34) being connected in parallel with said second resistor (28).

3. A voltage level monitoring and indicating apparatus (10), as set forth in claim 2, wherein said shifting means (22) includes:

a zener diode (36) having a cathode connected to said first resistor (26) and connected to a base of said transistor (34).

4. A voltage level monitoring and indicating apparatus (10), as set forth in claim 3, wherein said third resistor (34) is variable.

5. A voltage level monitoring and indicating apparatus (10), as set forth in claim 1, wherein said controlling means (38) is software programmed to take a predetermined number of samples of said pulse frequency signal and to average said predetermined number of samples.

6. A voltage level monitoring and indicating apparatus (10), as set forth in claim 1, wherein said controlling means (38) is software programmed to control said displaying means (42) to indicate a predetermined voltage level condition.

7. A voltage level monitoring and indicating apparatus (10), as set forth in claim 1, wherein said controlling means (38) is software programmed to control said displaying means (42) to display any one of a predetermined range of numbers.

8. A voltage level monitoring and indicating apparatus (10), as set forth in claim 7, wherein said controlling means (38) is software programmed to control said displaying means (42) to display a numerical sequence of said numbers in response to a predetermined voltage level condition.

9. Apparatus (10) for monitoring and indicating the voltage level of a battery, comprising:

(a) a voltage-to-frequency converter (12) having an input (14) and an output (18) and being constructed to produce a pulse frequency signal at said output (18) proportional to a voltage signal at said input;

(b) an input conditioning circuit (16) including (i) a battery voltage divider (24) having a first resistor (26) and a second resistor (28), said input (14) being connected between said first resistor (26) and said second resistor (28), (ii) a series-connected third resistor (32) and transistor (34) connected in parallel across said second resistor (28), and (iii) a zener diode (36) connected in parallel across said first resistor (26) and said second resistor (28), said transistor (34) having a base connected to said zener diode (36);

(c) a microprocessor (40) being software programmed to calculate average battery voltage level data in response to the pulse frequency signal, to scale the calculated average battery voltage level data to a number in a range of numbers, and to sequentially produce the numbers in the range in response to a predetermined scaled number; and (d) means (42) for displaying the scaled number of the sequence of numbers.

10. Apparatus (10) for monitoring a voltage source, comprising:

means (20) for receiving a source voltage signal from said voltage source;

means (22) for automatically modifying said source voltage signal and forming a predetermined output voltage signal in response to said source voltage signal being either of a first and second predetermined magnitude;

means (11) for converting said output voltage signal to a frequency signal in response to receiving said output voltage signal;

means (38) for controllably delivering a respective one of a predetermined set of digital control signals in response to receiving said frequency signal; and, means (42) for displaying predetermined data in response to receiving respective ones of said digital control signals.

11. Apparatus (10), as set forth in claim 10, wherein said controllable delivering means (38) sequentially delivers said digital control signals in response to said source voltage signal being less than a predetermined magnitude.

12. Apparatus (10), as set forth in claim 10, wherein said controllable delivering means (38) is free from delivering said digital control signals in response to receiving less than a predetermined plurality of said frequency signals.

13. Apparatus (10), as set forth in claim 10, wherein said modifying means (22) includes a voltage divider (24) having first and second series connected resistors (26,28);

a third resistor (32) and a transistor (34) being connected in series with one another, said series connected resistor (32) and transistor (34) being connected in parallel with said second register (28); and, a zener diode (36) having a cathode connected to said first resistor (26) and an anode connected to said transistor (34).

14. Apparatus (10), as set forth in claim 13, wherein said third resistor (32) is variable.

* * * * *